(12) United States Patent
Hidaka et al.

(10) Patent No.: US 10,646,844 B2
(45) Date of Patent: May 12, 2020

(54) VAPORIZATION SUPPLY APPARATUS

(71) Applicant: FUJIKIN INCORPORATED, Osaka (JP)

(72) Inventors: Atsushi Hidaka, Osaka (JP); Masaaki Nagase, Osaka (JP); Kaoru Hirata, Osaka (JP); Katsuyuki Sugita, Osaka (JP); Takatoshi Nakatani, Osaka (JP); Satoru Yamashita, Osaka (JP); Kouji Nishino, Osaka (JP); Nobukazu Ikeda, Osaka (JP); Keiji Hirao, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 244 days.

(21) Appl. No.: 15/565,696

(22) PCT Filed: Apr. 11, 2016

(86) PCT No.: PCT/JP2016/001967
§ 371 (c)(1),
(2) Date: Oct. 11, 2017

(87) PCT Pub. No.: WO2016/174832
PCT Pub. Date: Nov. 3, 2016

(65) Prior Publication Data
US 2018/0071702 A1  Mar. 15, 2018

(30) Foreign Application Priority Data
Apr. 30, 2015  (JP) ................................ 2015-093494

(51) Int. Cl.
*B01J 4/00* (2006.01)
*B01J 7/02* (2006.01)
(Continued)

(52) U.S. Cl.
CPC ................. *B01J 4/008* (2013.01); *B01J 7/02* (2013.01); *C23C 16/448* (2013.01);
(Continued)

(58) Field of Classification Search
None
See application file for complete search history.

(56) References Cited

U.S. PATENT DOCUMENTS

| | | | |
|---|---|---|---|
| 2011/0100483 A1* | 5/2011 | Nagata | .................... B01B 1/005 137/334 |
| 2012/0018037 A1* | 1/2012 | Nakagawa | .......... C23C 16/4482 141/67 |

(Continued)

FOREIGN PATENT DOCUMENTS

| | | |
|---|---|---|
| JP | H02-261529 A | 10/1990 |
| JP | 2000-133644 A | 5/2000 |

(Continued)

OTHER PUBLICATIONS

English translation of JP2000133644A. (Year: 2000).*
(Continued)

*Primary Examiner* — Matthew D Krcha
(74) *Attorney, Agent, or Firm* — Studebaker & Brackett PC (57) ABSTRACT

A vaporization supply apparatus comprises a vaporizer which heats and vaporize a liquid, a flow-rate control device which controls a flow rate of a gas sent out from the vaporizer, a first control valve interposed in a supply channel of a liquid to the vaporizer, a pressure detector for detecting a pressure of a gas vaporized by the vaporizer, a liquid detection part for measuring parameters of a liquid in an amount higher than a predetermined amount in the vaporizer, and a control device which controls the first control valve to supply a predetermined amount of a liquid to the vaporizer based on the pressure value detected by the pressure detector, and to close the first control valve when the liquid detection part detect a liquid in an amount higher than the predetermined amount.

12 Claims, 7 Drawing Sheets

(51) Int. Cl.
*C23C 16/52* (2006.01)
*H01L 21/31* (2006.01)
*C23C 16/448* (2006.01)
*H01L 21/3213* (2006.01)
*H01L 21/67* (2006.01)
*H01L 21/205* (2006.01)

(52) U.S. Cl.
CPC .......... *C23C 16/4485* (2013.01); *C23C 16/52* (2013.01); *H01L 21/31* (2013.01); *H01L 21/32135* (2013.01); *H01L 21/6708* (2013.01); *H01L 21/205* (2013.01)

(56) References Cited

U.S. PATENT DOCUMENTS

| | | | |
|---|---|---|---|
| 2014/0216339 A1* | 8/2014 | Nagase | C23C 16/4485 118/712 |
| 2015/0322567 A1 | 11/2015 | Hidaka et al. | |

FOREIGN PATENT DOCUMENTS

| | | | | |
|---|---|---|---|---|
| JP | 2000133644 A | * | 5/2000 | |
| JP | 2005-217089 A | | 8/2005 | |
| JP | 2005217089 A | * | 8/2005 | |
| JP | 2009-252760 A | | 10/2009 | |
| JP | 2010-173660 A | | 8/2010 | |
| JP | 2010-180429 A | | 8/2010 | |
| JP | 2013033782 A | * | 2/2013 | ......... C23C 16/4485 |
| JP | 2013-077710 A | | 4/2013 | |
| JP | 2014-114463 A | | 6/2014 | |
| WO | 2009/122646 A1 | | 10/2009 | |
| WO | 2010/086805 A1 | | 8/2010 | |
| WO | 2013/046517 A1 | | 4/2013 | |
| WO | 2014/087592 A1 | | 6/2014 | |

OTHER PUBLICATIONS

English translation of JP2005217089A. (Year: 2005).*
International Search Report issued in PCT/JP2016/001967; dated Jun. 28, 2016.

* cited by examiner

VAPORIZATION SUPPLY APPARATUS

TECHNICAL FIELD

The present invention relates to a vaporization supply apparatus for supplying vaporized liquid raw material used for semiconductor manufacturing devices, chemical industry equipment, pharmaceutical industry equipment, etc.

BACKGROUND ART

Conventionally, for example, liquid raw material vaporization supply apparatuses for supplying raw material fluids have been used for semiconductor manufacturing devices, in which the metal organic chemical vapor deposition (MOCVD) is used (for example patent documents 1 to 4).

Figure 8:
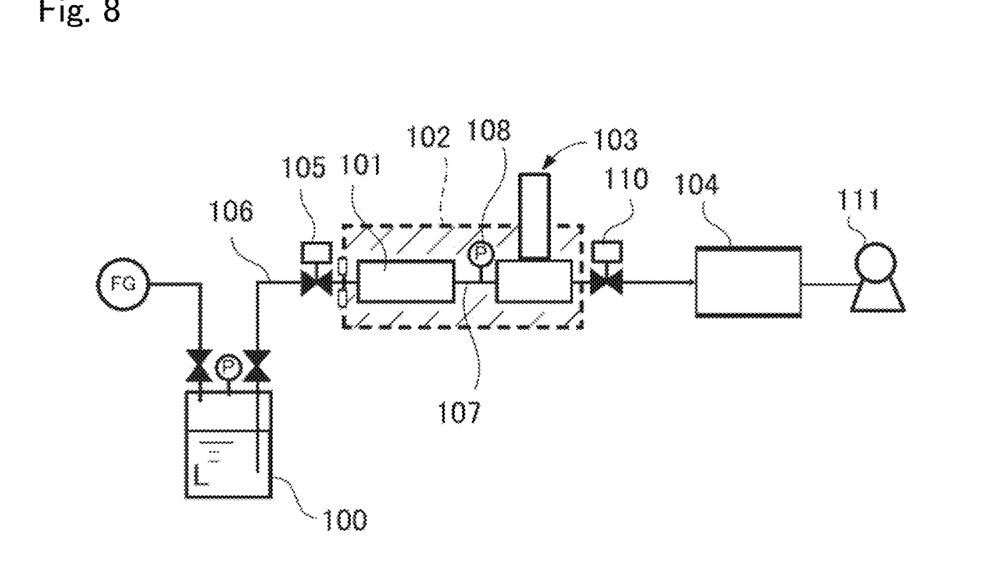
FIG. 8 is a schematic block diagram which shows a known vaporization supply apparatus.

This kind of liquid raw material vaporization supply apparatus, for example, as shown in FIG. 8, stores a liquid raw material L such as TEOS (Tetraethyl orthosilicate) in a liquid storage tank 100, supplies a pressurized inert gas FG to the liquid storage tank 100, pushes out the liquid raw material L in the liquid storage tank 100 with a constant pressure by the pressurized inert gas FG and supplies to a vaporizer 101, heats the liquid raw material L in the vaporizer 101 by a heating means 102 such as a jacket heater to vaporize the liquid raw material L, controls the vaporized gas to have a predetermined flow rate by a flow-rate control device 103 and supplies the gas to a semiconductor manufacturing device 104. In FIG. 8, a numeral 110 represents a stop valve, and a numeral 111 represents a vacuum pump.

In order to replenish a reduced liquid raw material L in the vaporizer 101 due to the vaporization of the liquid raw material L in the vaporizer 101, it is necessary to detect a reduction in the liquid raw material L and replenish the reduced portion to the vaporizer 101.

Conventionally, for detecting the reduction in the liquid raw material in the vaporizer 101 and replenish the same, a control valve 105, which controls the supply of the liquid raw material L to the vaporizer 101, is provided in a supply channel 106 to the vaporizer 101, a pressure detector 108 is disposed to detect the pressure of the gas in a gas passage 107 communicating with the vaporizer 101 and the flow-rate control device 103, and the control sequence including the following steps has been repeatedly performed: monitoring the gas pressure in the vaporizer 101 by the pressure detector 108, when the detection pressure of the pressure detector 101 becomes a predetermined value or lower because the liquid raw material L in the vaporizer 101 is vaporized and reduced in an amount, opening the control valve 105 for a predetermined time, then closing the control valve 105 to supply a predetermined amount of the liquid raw material into the vaporizer 101. When the liquid raw material L in the vaporizer 101 is again vaporized and decreased so that the detected pressure reaches the predetermined value, opening the control valve 105 for a certain period of time and then closing the same.

CITATION LIST

Patent Literature

Patent Document 1: Japanese Unexamined Patent Publication No. 2009-252760
Patent Document 2: Japanese Unexamined Patent Publication No. 2010-180429
Patent Document 3: Japanese Unexamined Patent Publication No. 2013-77710
Patent Document 4: Japanese Unexamined Patent Publication No. 2014-114463

SUMMARY OF INVENTION

Technical Problem

However, when the problem that the inside of the gas passage in communication with the flow-rate control device from the vaporizer is filled with the liquid raw material due to any accidents or the like occurs, there is the problem that the flow rate of the gas cannot be controlled by the flow-rate control device and the gas cannot be supplied.

Therefore, a main object of the present invention is to provide a vaporization supply apparatus which can resolve the problem that the inside of the gas passage which leads from inside the vaporizer to the flow-rate control device is filled with the liquid raw material.

Solution to Problem

IN order to achieve the above object, the vaporization supply apparatus according to the present invention includes a vaporizer which heats and vaporizes a liquid, a flow-rate control device which controls the flow rate of the gas which is sent out from the vaporizer, a first control valve interposed in a supply channel of a liquid to the vaporizer, a pressure detector for detecting the pressure of the gas vaporized by the vaporizer and sent to the flow-rate control device, a liquid detection part for measuring the parameters of the liquid in an amount higher than a predetermined amount in the vaporizer, and a control device which controls the first control valve to supply a predetermined amount of the liquid to the vaporizer based on the pressure value detected by the pressure detector, and controls the first control valve to close when the liquid detection part detects the liquid flowing into the vaporizer in an amount higher than the predetermined amount.

In one aspect, a second control valve interposed in gas passage between the vaporizer and the flow-rate control device is further provided, and the control device controls, when the liquid detection part detects an amount of the liquid higher than a predetermined amount flowing into the vaporizer, to close the first control valve and the second control valve.

Moreover, in order to achieve the above object, the vaporization supply apparatus according to the present invention includes a vaporizer which heats and vaporizes a liquid, a flow-rate control device which controls the flow rate of the gas which is sent out from the vaporizer, the first control valve interposed in a supply channel of a liquid to the vaporizer, a pressure detector for detecting the pressure of the gas vaporized by the vaporizer and sent to the flow-rate control device, a second control valve interposed in gas passage between the vaporizer and the flow-rate control device, a liquid detection part for measuring the parameters of the liquid in an amount higher than a predetermined amount in the vaporizer, and a control device which controls the first control valve to supply a predetermined amount of the liquid to the vaporizer based on the pressure value detected by the pressure detector, and controls the second control valve to close when the liquid detection part detects the liquid flowing into the vaporizer in an amount higher than a predetermined amount.

The liquid detection part can be a temperature detector.
The liquid detection part can be a level gauge.
The liquid detection part can be a load cell.

The vaporizer can be provided with a vaporizing chamber, and the liquid detection part can be disposed in the vaporizing chamber.

The vaporizer can be provided with a vaporizing chamber and a gas heating chamber which is in communication with the vaporizing chamber, and the liquid detection part can be disposed in the gas heating chamber.

Advantageous Effects of Invention

The vaporization supply apparatus according to the present invention is capable of measuring the parameters of the liquid raw material which are higher than predetermined amounts in the vaporizer by the liquid detection part, and when the liquid detection part detects the liquid flowing into the vaporizer in an amount higher than the predetermined amount, closing the first control valve, whereby the supply of the liquid raw material in an excessive amount into the vaporizer is stopped, and the liquid raw material can be prevented from entering into the gas passage in advance.

In addition, when the liquid detection part detects the liquid flowing into the vaporizer in an amount higher than the predetermined amount, closing the first control valve, whereby when the raw material liquid in the vaporizer is run out, the supply of gas to the flow-rate control device stops, and therefore it can be confirmed that abnormality caused by the product life cycle, aging deterioration, etc. has occurred with the pressure detector.

Furthermore, when the liquid detection part detects the liquid raw material in the vaporizer in an amount higher than a predetermined amount, the outflow of the liquid raw material from the vaporizer can be prevented by closing the second control valve, and the liquid raw material can be prevented from entering into the gas passage in advance.

When the liquid raw material flows in an amount higher than the predetermined amount and the liquid flow into a region where the material should be present in a gaseous state, the temperature of the region is lowered, and therefore the liquid raw material in an amount higher than the predetermined amount in the vaporizer can be detected by measuring this reduction in temperature using a temperature detector as the liquid detection part.

Moreover, when the liquid raw material flows in an amount higher than the predetermined amount and the liquid flow into a region where the material should be present in a gaseous state, the liquid level in the region elevates, and therefore the liquid raw material in an amount higher than a predetermined amount in the vaporizer can be detected by measuring an increase in this liquid level using a level gauge as the liquid detection part.

Further, when the liquid raw material flows in an amount higher than the predetermined amount and the liquid flows into a region where the liquid raw material should be present in a gaseous state, the weight of the liquid in the vaporizer increases, therefore the liquid raw material in an amount higher than a predetermined amount in the vaporizer can be detected by measuring this increase in weight using a load cell as the liquid detection part.

DESCRIPTION OF EMBODIMENTS

Embodiments of a vaporization supply apparatus according to the present invention will be described below with reference to drawings. It should be noted that throughout the embodiments, the same or similar components are denoted with the same numerals.

Figure 1:
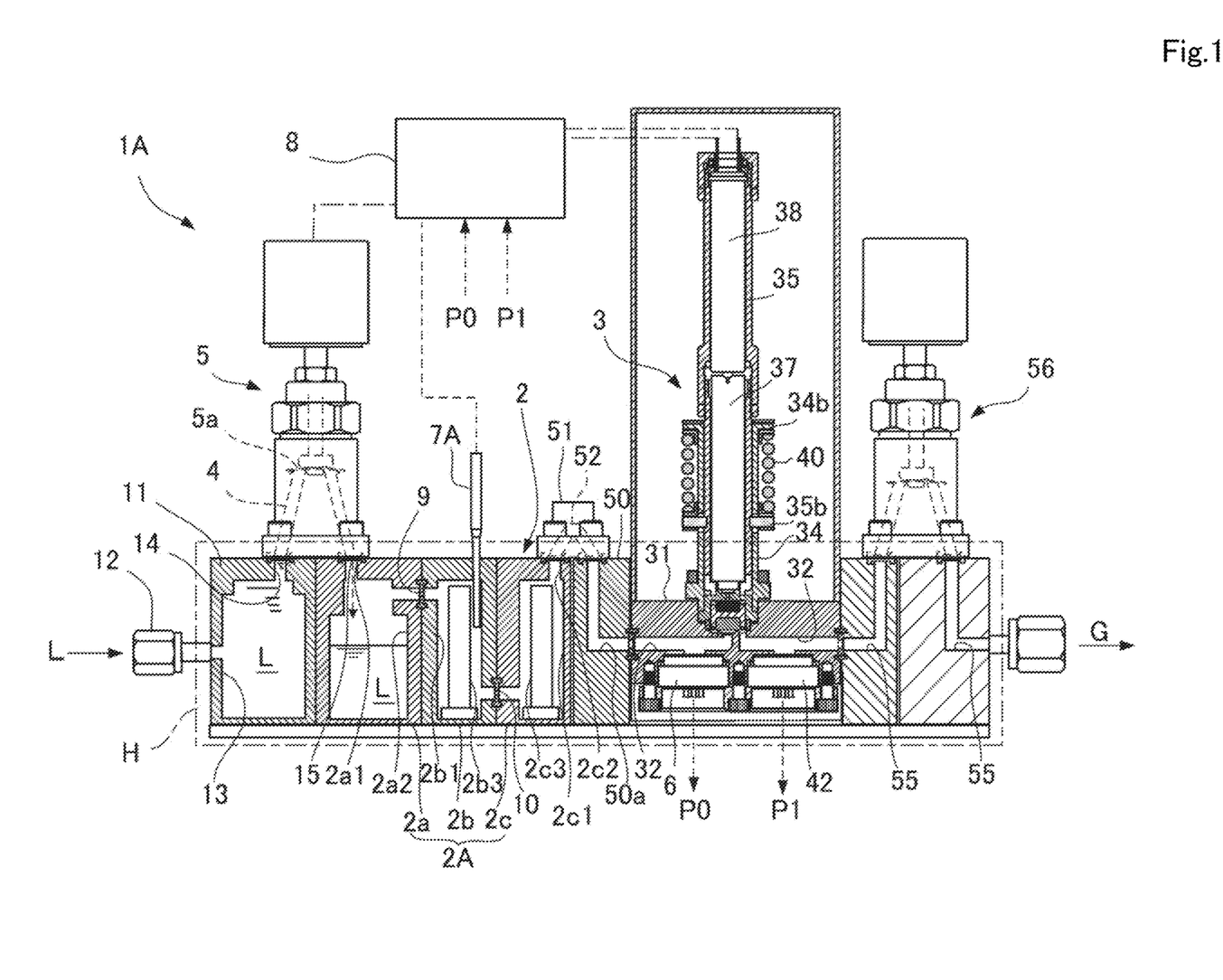
FIG. 1 is a partial longitudinal front view which shows a first embodiment of the vaporization supply apparatus according to the present invention.

FIG. 1 shows a first embodiment of the vaporization supply apparatus according to the present invention. As shown in FIG. 1, a vaporization supply apparatus 1A includes a vaporizer 2 which heats and vaporizes a liquid raw material L, a flow-rate control device 3 which controls the flow rate of a gas G which is sent out from the vaporizer 2, a first control valve 5 which is interposed in a supply channel 4 of the liquid raw material L to the vaporizer 2, a pressure detector 6 for detecting the pressure of the gas G vaporized by the vaporizer 2 and sent to the flow-rate control device 3, a liquid detection part 7A which measures the parameters of the liquid raw material L higher than a predetermined amount in the vaporizer 2, and a control device 8 which controls the first control valve 5 to supply a predetermined amount of the liquid raw material L to the vaporizer 2 based on a pressure value detected by the pressure detector 6, and controls to close the first control valve 5 when the liquid detection part 7A detects liquid.

The vaporizer 2 is provided with a main body 2A formed of stainless steel. The main body 2A is wrapped with a heating means H such as a jacket heater for heating indicated by an imaginary line. The main body 2A is composed by connecting a first block body 2a, a second block body 2b, and a third block body 2c. The first block body 2a has a liquid supply port 2a1 formed in its upper part, and has a vaporizing chamber 2a2 formed within the same. In the second block body 2b, a first gas heating chamber 2b1 which is in communication with an upper part of the vaporizing chamber 2a2 of the first block body 2a is formed. The third block body 2c has a second gas heating chamber 2c1 which is in communication with the first gas heating chamber 2b1 formed within itself, and has a gas outlet 2c2 formed in its upper part. In the first gas heating chamber 2b1 and the second gas heating chamber 2c1, columnar heating accelerators 2b3, 2c3 are installed in a cylindrical space, and the gap between the cylindrical space and the heating accelerators 2b3, 2c3 serves as a gas passage. In the gas communication parts between the first block body 2a and the second block body 2b, and between the second block body 2b and the third block body 2c, respectively, gaskets 9, 10 with through holes are interposed, and gas passes through the through holes of these gaskets 9, 10 with through holes, whereby the pulsation of the gas is prevented.

A block body 11 for preliminary heating of the liquid raw material L is connected to the first block body 2a. The block body 11 for preliminary heating has a liquid inflow port 12 connected to its side face, has a liquid storage chamber 13 which is in communication with the liquid inflow port 12 formed in itself, and has a liquid outflow port 14 which is in communication with the liquid storage chamber 13 formed on its upper face. The block body 11 for preliminary heating stores the liquid raw material L which is force-fed by a predetermined pressure from a liquid storage tank, which is not illustrated (refer to numeral 100 in FIG. 8), in the liquid storage chamber 13, and preheats the liquid raw material L by the heating means H such as the jacket heater.

The first control valve 5 is fixed across the upper faces of the first block body 2a and the block body 11 for preliminary heating. The first control valve 5 controls the amount of the liquid raw material L supplied to the vaporizer 2 by opening and closing the supply channel 4 which brings the liquid outflow port 14 of the block body 11 for preliminary heating and the liquid supply port 2a1 of the first block body 2a into communication or by adjusting the opening degree of the same. As the first control valve 5 of in the illustrated example, an air operated valve which controls opening and closing of a valve element 5a by using air pressure is used. The liquid supply port 2a1 of the first block body 2a has a gasket 15 in which pores are formed, and the amount of the liquid raw material supplied into the vaporizing chamber 2a2 is adjusted by passing the liquid raw material through the pores of the gasket 15.

Figure 2:
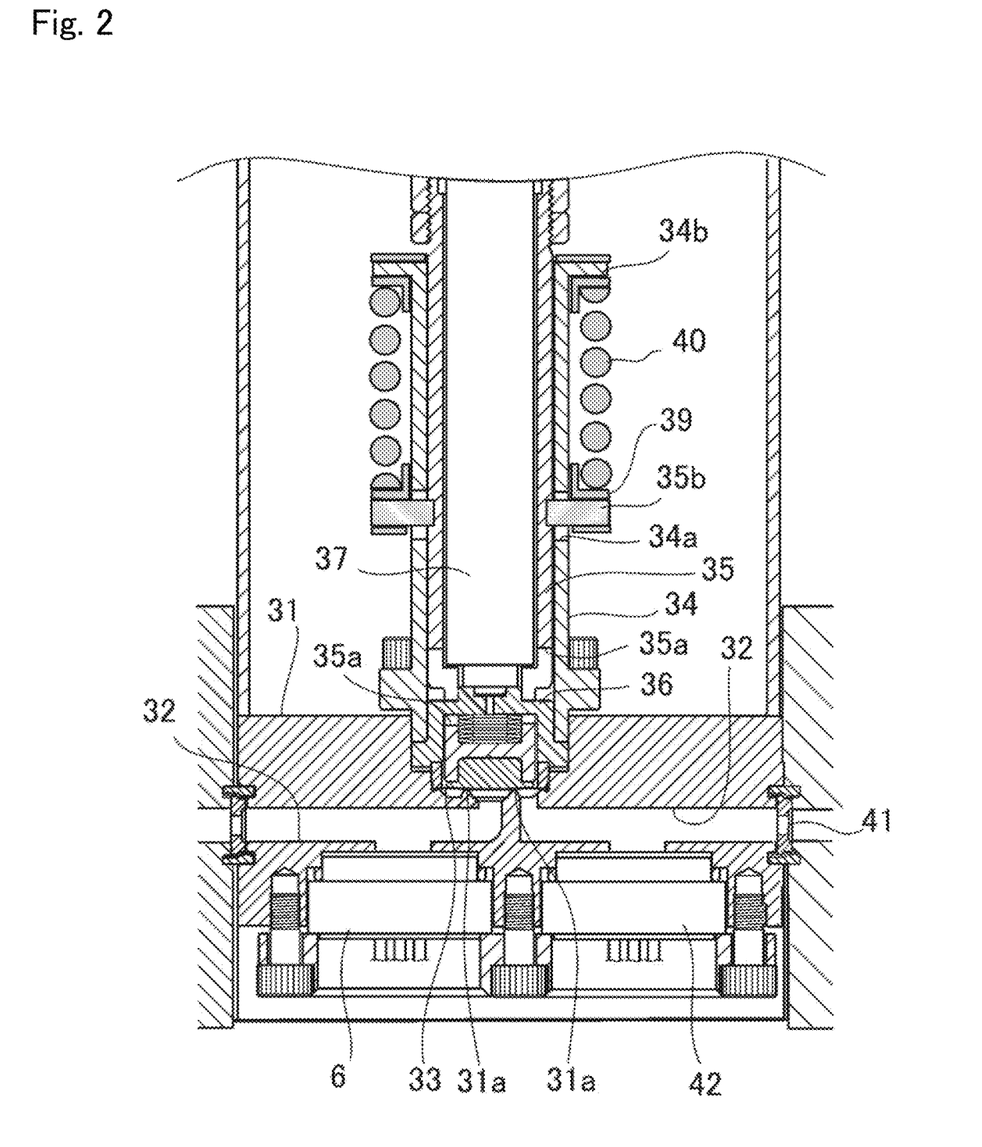
FIG. 2 is a partially enlarged view of FIG. 1.

The flow-rate control device 3 in the illustrated example is a known flow-rate control device referred to as a pressure-type flow-rate control device of high temperature type. With reference to FIGS. 1 and 2, this flow-rate control device 3 includes, a valve block 31, a gas passage 32 formed in the valve block 31, a metal diaphragm valve element 33 interposed in the gas passage 32, a cylindrical guide member 34 which is fixed and provided upright on the valve block 31, a valve rod case 35 slidably inserted into the cylindrical guide member 34, a bridge 36 which is pressed against and fixed to the valve block 31 by the cylindrical guide member 34 which pass through holes 35a, 35a formed in a lower part of the valve rod case 35, a heat radiation spacer 37 and a piezoelectric driven element 38 which are accommodated in the valve rod case 35 and supported by the bridge 36, a flange receiver 35b, which is formed to protrude the outer periphery of the valve rod case 35 and extend passing through a hole 34a formed on the cylindrical guide member 34, a flange body 39 attached to the flange receiver 35b, a flange portion 34b formed in an upper end portion of the cylindrical guide member 34, a coil spring 40 disposed in a compressed state between the flange portion 34b and the flange body 39, a pored thin plate 41 having micropores formed therein interposed in the gas passage 32 on a downstream side of a metal diaphragm valve element 33, and a pressure detector for controlling flow rate control 42, which detects the pressure in the gas passage 32 between the metal diaphragm valve element 33 and the pored thin plate 41. The heat radiation spacer 37 formed of Invar material and the like prevents the piezoelectric driven element 38 to be heated to a heat resistant temperature or higher even if a gas at a high temperature flows into the gas passage 32.

When the piezoelectric driven element 38 is not energized, the valve rod case 35 is pushed downwardly by coil spring 40 in FIG. 2, and as shown in FIG. 2, the metal diaphragm valve element 33 is in contact with a valve seat 31a to close the gas passage 32. The piezoelectric driven element 38 is elongated by energizing the piezoelectric driven element 38, and by lifting the valve rod case 35 upwardly in FIG. 2 against the elastic force of the coil spring 40, the metal diaphragm valve element 33 returns to its original inverted plate form by the self-elastic force to open the gas passage 32.

The flow-rate control device 3 detects the gas pressure on at least the upstream side of the pored thin plate 41 by a pressure detector for controlling flow rate control 42, and controls the flow rate by opening and closing the metal diaphragm valve element 33 interposed in the gas passage 32 by the piezoelectric driven element 38 based on the detected pressure signal. When the absolute pressure on the upstream side of the pored thin plate 41 is about twice the absolute pressure on the downstream side of the pored thin plate 41 or higher (critical expansion condition), the flow rate of the gas passing through the micropores of the pored thin plate 41 becomes the sonic speed, and does not become higher than the sonic speed. Therefore the flow rate depends only on the pressure on the upstream side of the micropores, and the flow rate of the gas passing through the micropores of the pored thin plate 41 is proportionate to the pressure. The flow rate control utilizes this principle. It should be noted that, although not illustrated, it is also possible to detect the pressure on the downstream side of micropores of the pored thin plate 41, and to control the flow rate based on the differential pressure between the upstream side and the downstream side of the micropores. The pored thin plate 41 in the illustrated example is an orifice plate in which an orifice is formed. However, the holes of the pored thin plate 41 are not limited to orifices but may be any structure which draws the fluid.

A spacer block 50 is connected to the third block body 2c, and the valve block 31 is connected to the spacer block 50. A gas passage 52 in a flow passage block 51 fixed across the third block body 2c and the spacer block 50 brings the second gas heating chamber 2c1, which is a gas passage of the third block body 2c, and a gas passage 50a of the spacer block 50 into communication. The gas passage 50a of the spacer block 50 is in communication with the gas passage 32 of the valve block 31.

A pressure detector 6 is provided to an upstream position of the metal diaphragm valve element 33 disposed in the gas passage 32 of the valve block 31. The pressure of the gas vaporized by the vaporizer 2 and sent to the flow-rate control device 3 is detected by the pressure detector 6.

A signal (P0) of the pressure value detected by the pressure detector 6 is constantly sent to the control device 8 and is monitored. When the amount of the liquid raw material L in the vaporizing chamber 2a2 is decreased due to vaporization, the internal pressure in the vaporizer 2 is lowered. When the liquid raw material L in the vaporizing chamber 2a2 is decreased, the internal pressure in the vaporizer 2 is lowered, and the detected pressure by the pressure detector 6 reaches a preliminary set value, the control device 8 opens the first control valve 5 only for a predetermined period of time and then closes the same, whereby a predetermined amount of the liquid raw material L is supplied to the vaporizing chamber 2a2. When a predetermined amount of the liquid raw material L is supplied to the vaporizing chamber 2a2, the gas pressure in the vaporizer 2 is increased due to the vaporization of the liquid raw material L, thereafter, the decrease in the liquid raw material L again causes the internal pressure in the vaporizer 2 to be lowered. When the internal pressure of the vaporizer 2 reaches the set value, as mentioned above, the first control valve 5 is again opened only for a predetermined period of time and then closed. By such a control sequence, a predetermined amount of the liquid raw material is successively replenished to the vaporizing chamber 2a2.

The maximum level of the liquid raw material L supplied to the vaporizing chamber 2a2 is set in advance, and depending on the maximum level, the predetermined amount of the liquid raw material L supplied to the vaporizing chamber 2a2 is set. The level of the liquid raw material L in the vaporizing chamber 2a2 shown in FIG. 1 indicates the set maximum level.

A stop valve 56 is provided in a gas passage 55 on the downstream side of the flow-rate control device 3.

The vaporization supply apparatus 1A of the first embodiment employs, as the liquid detection part 7A which measures the parameters of the liquid raw material higher than a predetermined amount in the vaporizer 2, a temperature detector which measures and monitors the temperature in the first gas heating chamber 2b1. The temperature detector which configures the liquid detection part 7A used can be a known temperature detector such as a platinum resistance thermometer sensor, a thermocouple, a thermistor, or an infrared thermometer. In the example illustrated, a protective tube type platinum resistance thermometer sensor having a platinum resistance thermometer sensor inserted into a protective tube is used.

In the example illustrated, for example, the temperature of the liquid raw material L in the vaporizing chamber 2a2 is maintained at 185° C., and the temperature of the gas in the first gas heating chamber 2b1 is maintained at 195° C. If the liquid raw material L flows out from the vaporizing chamber 2a2 and flows into the first gas heating chamber 2b1, the liquid raw material L comes into contact with the temperature detector which configures the liquid detection part 7A. By the reduction in the measured temperature of the temperature detector, it can be detected that the liquid raw material has flown into the first gas heating chamber 2b1.

The control device 8 always monitors the temperature detected by the temperature detector which configures the liquid detection part 7A, and determines that the liquid raw material L flows into the first gas heating chamber 2b1 when a decrease in the above temperature is found, and closes the first control valve 5. At this time, even if the detected signal of the pressure detector 6 is lower than the set value, the control device 8 is programmed to close the first control valve 5.

Therefore, when the liquid raw material L flows into the first gas heating chamber 2b1, the first control valve 5 is immediately closed. Accordingly, when the liquid raw material L flows into the first gas heating chamber 2b1, even if the detected pressure value is lower than the set value due to any accidents such as the malfunction of the pressure detector 6, the first control valve 5 is not opened and is immediately closed. Therefore, the problem that the gas passage 32 from the vaporizer 2 to the flow-rate control device 3 is filled with the liquid raw material can be prevented in advance.

Moreover, when the liquid detection part 7A detects the liquid raw material L and closes the first control valve 5, the liquid raw material L in the vaporizer 2 vaporizes and disappears, whereby the supply of the raw material gas to the flow-rate control device 3 stops. Therefore, in this case, it is determined that any abnormality, for example, that caused by product life, aging deterioration, etc., occurred in the pressure detector 6.

The temperature detector which configures the liquid detection part 7A can be disposed not only in the first gas heating chamber 2b1 but also in the second gas heating chamber 2c1, and can be also disposed in a space above the set maximum level of the vaporizing chamber 2a2.

Figure 3:
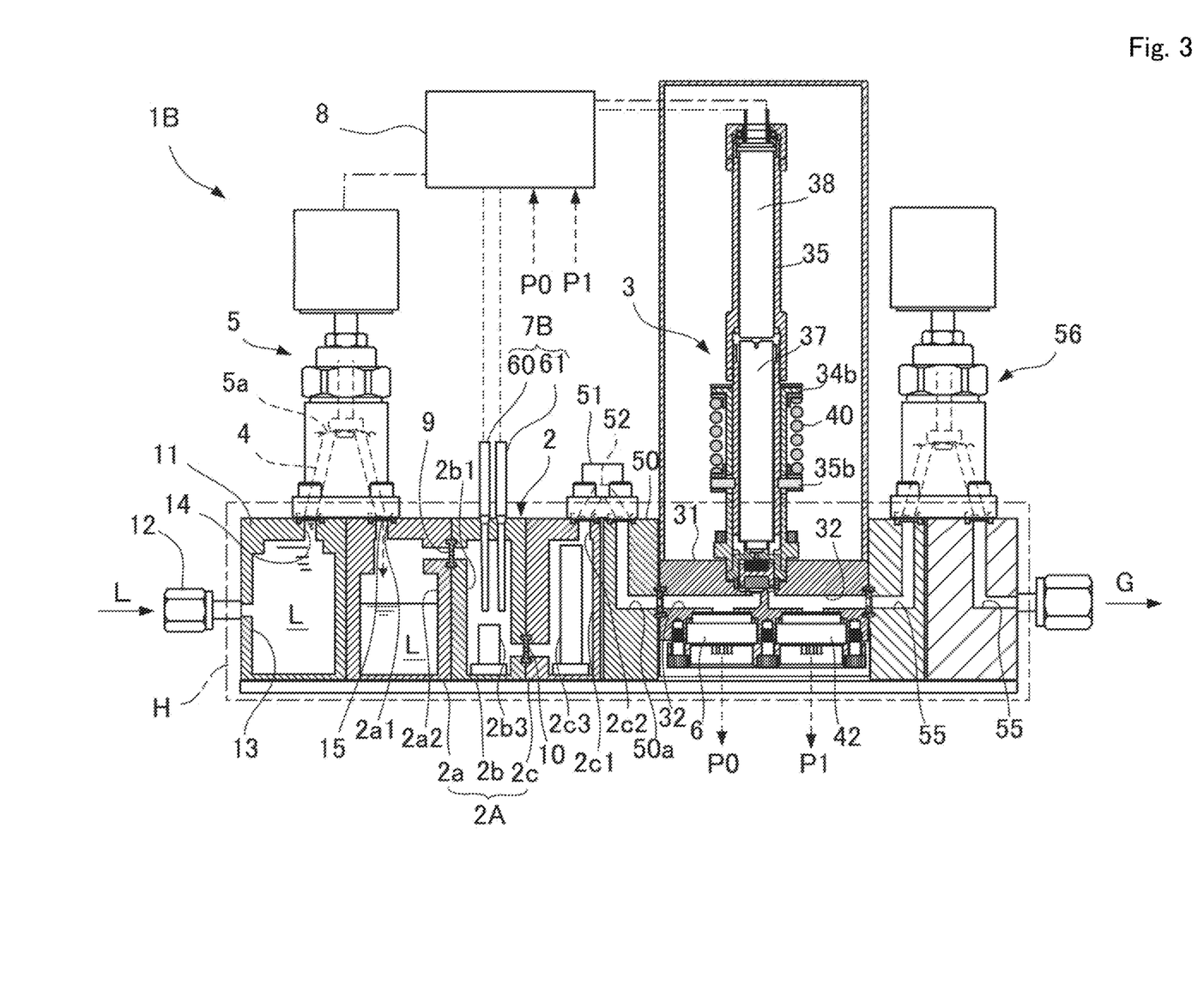
FIG. 3 is a partial longitudinal front view which shows a second embodiment of a vaporization supply apparatus according to the present invention.

FIG. 3 shows a second embodiment of a vaporization supply apparatus according to the present invention. A vaporization supply apparatus 1B of the second embodiment is different from that of the above-mentioned first embodiment mainly in that the liquid detection part 7B for measuring the parameters of the liquid raw material higher than a predetermined amount in the vaporizer 2 is a level gauge which measures changes in the liquid level in the vaporizer 2, while it has other configurations similar to those of the above first embodiment.

Since the inside of the vaporizer 2 is under circumstances at a high temperature and a high humidity, a thermal type level gauge utilizing the difference in dissipation constant of the heater element between a liquid phase and a gaseous phase can be suitably used as a level gauge configuring the liquid detection part 7B.

The principle of this kind of thermal type level gauge will be described below with reference to FIGS. 4 and 5. In the thermal type level gauge, two protective tubes 60, 61 in which resistance thermometer bulbs R1, R2 made of platinum or the like are sealed, respectively, are disposed. To one of the resistance thermometer bulb R1, a relatively large constant current I1 (heating current) is applied to maintain at a temperature above the ambient temperature by self-heating the resistance thermometer bulb R1. While to the other resistance thermometer bulb R2, a fine constant current I2 (current for measuring ambient temperature) having such a magnitude that allows measurement of the ambient temperature and causes an ignorable degree of heating is applied.

Accordingly, the resistance thermometer bulb R1 is heated by the large current I1 applied thereto. At this time, the dissipation constant of the heater element when the resistance thermometer bulb is in the liquid phase L is greater than the dissipation constant of the heater element when in a gaseous phase V, and therefore the temperature of the resistance thermometer bulb when in the gaseous phase V is higher than that in the liquid phase.

Since this means that the resistance thermometer bulb in the gaseous phase has a resistance value higher than the resistance temperature value in the liquid phase, by observing the difference between the voltage output of the resistance thermometer bulb R1 with a large current applied thereto the voltage and the voltage output of the resistance thermometer bulb R2 with a fine current applied thereto, it can be judged whether the resistance thermometer bulb is above or below the liquid surface. That is, when the difference is small, it can be judged that the resistance thermometer bulb is below the liquid surface, while when the difference is large, it can be judged that the resistance thermometer bulb is above the liquid surface.

Figure 4:
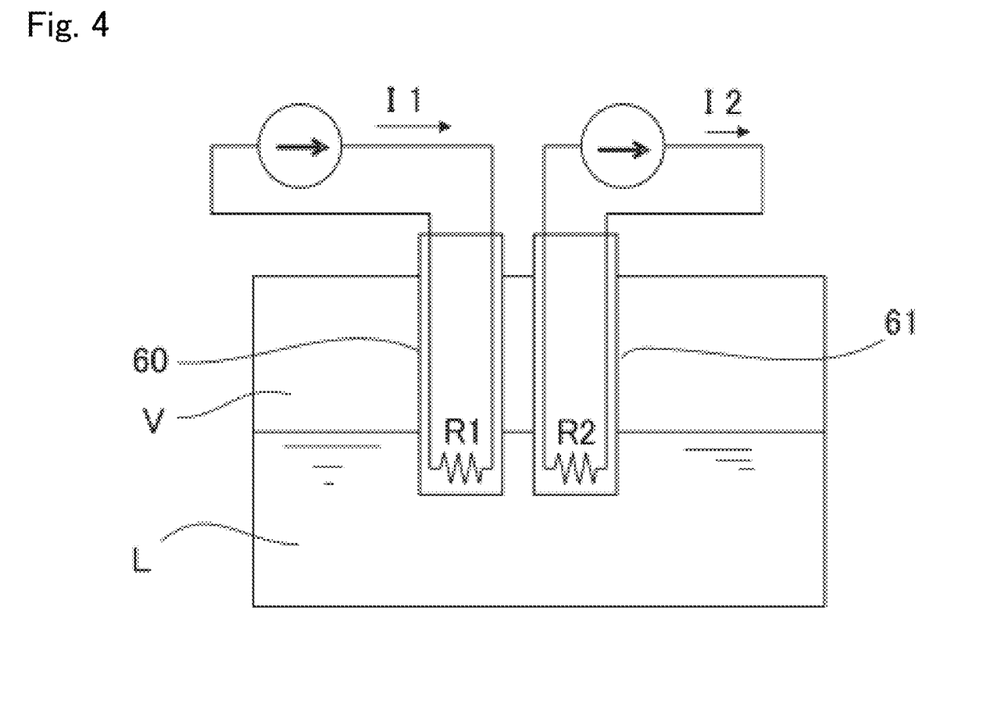
FIG. 4 is an illustrative drawing of a thermal type level gauge.
Figure 5:
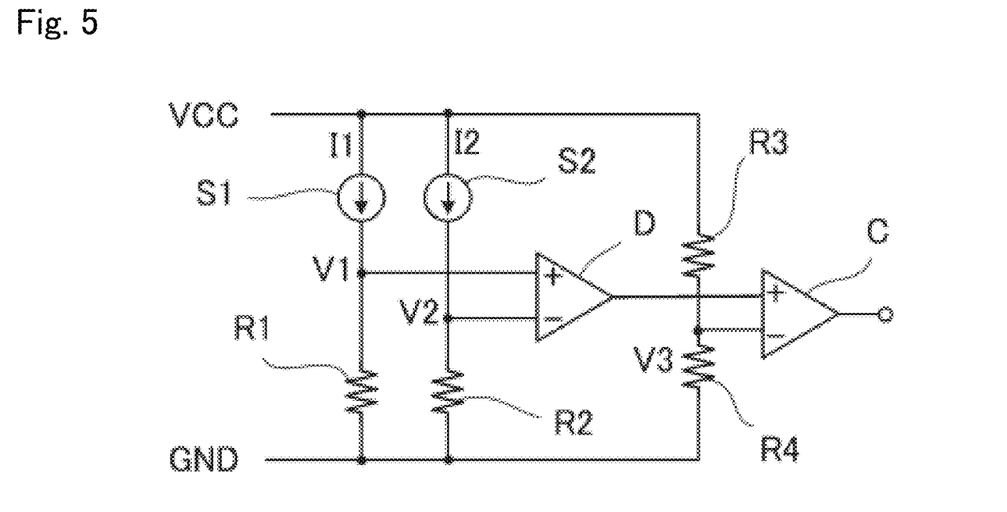
FIG. 5 is a detection circuit diagram of the thermal type level gauge.

FIG. 4 is an example of liquid level detection circuit, wherein a constant current is supplied from a power source Vcc via constant current circuits S1, S2 to the resistance thermometer bulb R1, R2. A fine current having such a magnitude that allows a measurement of the ambient temperature and causes an ignorable degree of heating is applied to the resistance thermometer bulb R2. The resistance thermometer R1 needs to be heated to a high temperature, so that a current which is larger than that applied to the resistance thermometer R2 and is relatively large needs to be applied. For this reason, it is designed to apply a current larger to the constant current circuit S1 than to the constant current circuit S2. A terminal voltage V1 of the resistance thermometer bulb R1 and a terminal voltage V2 of the resistance thermometer bulb R2 are input to the inverting input and non-inverting input of a differential amplifier circuit D, respectively, while a voltage signal which corresponds to the differential voltage (V1−V2) of the terminal voltage V1, V2 from the differential amplifier circuit D is input to a comparator C. The comparator C compares a reference voltage V3 set by voltage dividing resistors R3, R4 with the differential voltage.

When the resistance thermometer bulb R1 is immersed in the liquid phase, a rise in the temperature of the resistance thermometer bulb R1 relative to the ambient temperature is lower than that in the gaseous phase. As a result, an output voltage from the operation amplifier circuit D which corresponds to a difference from a voltage signal having a magnitude corresponding to the ambient temperature emitted from the resistance thermometer bulb R2 also in the liquid phase becomes smaller than the reference voltage, and the output of the comparator C turns to a low level. Meanwhile, when the liquid level lowers and the resistance thermometer bulb R1 is exposed to the gaseous phase, a rise in the temperature relative to the ambient temperature takes place in the gaseous phase. Therefore, an output voltage from the operation amplifier circuit D which corresponds to a difference from a voltage signal having a magnitude corresponding to the ambient temperature emitted from the resistance thermometer bulb R2 also in the gaseous phase becomes larger than the reference voltage, and the output of the comparator C turns to a high level. It is judge that when the output of the comparator C is at a high level, the resistance thermometer bulbs R1, R2 are in the gaseous phase, while the output of the comparator C is at a low level, the resistance thermometer bulbs R1, R2 are in the liquid phase.

By measuring the terminal voltages V1, V2, the resistance values of the resistance thermometer bulbs R1, R2 can be calculated according to Ohm's law from the current values I1, I2. When the resistance values of the resistance thermometer bulbs R1, R2 are known, if the resistance changing rates relative to the temperatures of the resistance thermometer bulbs R1, R2 are known, the temperatures of the resistance thermometer bulbs R1, R2 can be derived. Therefore, in the liquid level detection circuit, in place of the comparison of the voltage outputs of the resistance thermometer bulbs R1, R2, the judgment can be performed by comparing the resistance values of the resistance thermometer bulbs R1, R2, or by utilizing the resistance changing rate relative to the temperatures of the resistance thermometer bulbs R1, R2, comparing their temperatures by utilizing the resistance changing rate relative to the temperatures of the resistance thermometer bulbs R1, R2, comparing their temperatures, and measuring the temperatures of the resistance thermometer bulbs R1, R2 from the respective resistance values. In the case of platinum, it is 100Ω at 0° C., and the resistance value increases by 0.39Ω as the temperature rises by 1° C.

With reference to FIG. 3 again, in the vaporization supply apparatus 1B of the second embodiment, two protective tubes 60, 61 of the level gauge configuring the liquid detection part 7B are disposed in the first gas heating chamber 2b1. In the second embodiment, by installing the protective tubes 60, 61 in the first gas heating chamber 2b1, a heating accelerator 2b3 is shorter than that in the above first embodiment.

As the resistance thermometer bulbs sealed in the protective tubes 60, 61, platinum resistance thermometer sensors can be suitably used, but other known resistance thermometer bulbs can be also used. The protective tubes 60, 61 are installed in the vertical direction in the second embodiment, but they can be also installed in the horizontal direction.

When the level gauge configuring the liquid detection part 7B detects that the liquid raw material L has flown into the first gas heating chamber 2b1, the control device 8, as in the above-mentioned first embodiment, controls to close the first control valve 5, regardless of the detected pressure value from the pressure detector 6.

The level gauge configuring the liquid detection part 7B can be provided not only in the first gas heating chamber 2b1, but also in the vaporizing chamber 2a2 or the second gas heating chamber 2c1. Moreover, as the level gauge, not only the thermal type level gauge, but also a laser level gauge, a ultrasound wave level gauge, and other known level gauges can be employed. It should be noted that in the present invention, the "measurements" by the level gauge include the case where the change of the liquid level of the liquid raw material L from the maximum setting water level to the detected levels of the protective tubes 60, 61 is measured, and the case where the liquid level of the liquid raw material L and the distance from the level gauge is measured.

Figure 6:
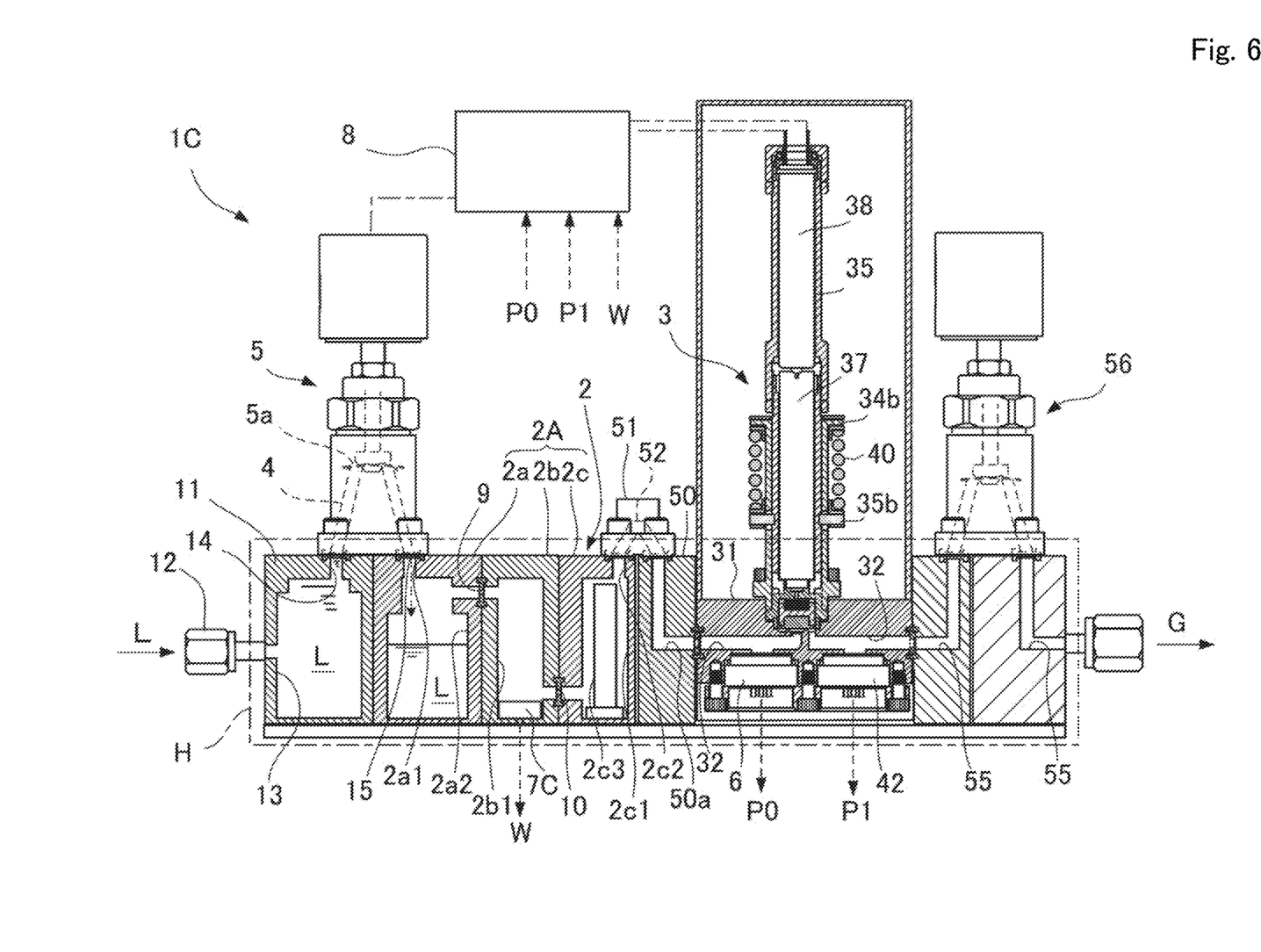
FIG. 6 is a partial longitudinal front view which shows a third embodiment of a vaporization supply apparatus according to the present invention.

Next, a third embodiment of a vaporization supply apparatus according to the present invention will be described with reference to FIG. 6. A vaporization supply apparatus 1C of the third embodiment, is different from that in the above-mentioned first embodiment in that the liquid detection part 7C which measures the parameters of the liquid raw material above the predetermined amounts in the vaporizer 2 is a load cell, but the other configurations are similar to those of the above-mentioned first embodiment.

The load cell which configures the liquid detection part 7C employed may be a plate-shaped load cell having a piezoelectric element integrated therein, and is installed at the bottom of a first gas heating chamber 2b1. It should be noted that in the third embodiment, a heating accelerator 2b3 provided in the first gas heating chamber 2b1 of the first embodiment is omitted. When the liquid raw material L flows into the first gas heating chamber 2b1, the detected weight of the liquid detection part 7C configured by the load cell increases, and it can be detected that the liquid raw material L has flown into the first gas heating chamber 2b1. The control device 8, when the liquid detection part 7 configured by the load cell detects the liquid raw material L flowing into the first gas heating chamber 2b1, as in the above-mentioned first embodiment, controls to close the first control valve 5, regardless of the detected pressure value from the pressure detector 6.

The load cell which configures the liquid detection part 7 can be disposed not only in the first gas heating chamber 2b1, but also at the bottom of the vaporizing chamber 2a2, or at the bottom of the second gas heating chamber 2c1.

Figure 7:
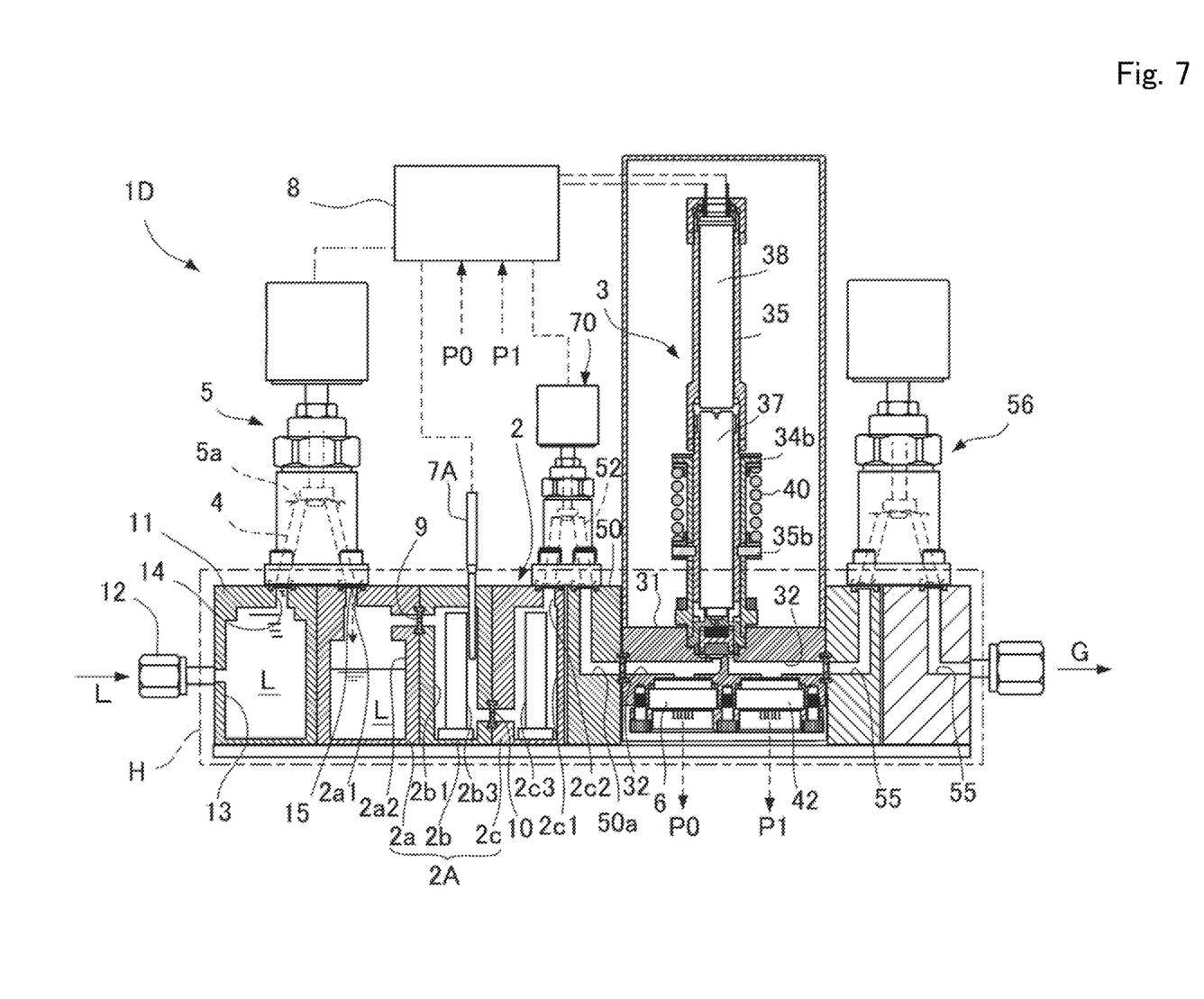
FIG. 7 is a partial longitudinal front view which shows a fourth embodiment of a vaporization supply apparatus according to the present invention.

Next, a fourth embodiment of a vaporization supply apparatus according to the present invention will be described with reference to FIG. 7. A vaporization supply apparatus 1D of the fourth embodiment is provided with, in place of the flow passage block 51 of the first embodiment, a second control valve 70 interposed in a gas passage 52 between a vaporizer 2 and a flow-rate control device 3.

The control device 8 controls to close the second control valve 70 when the liquid detection part 7A detects the liquid raw material L.

In one aspect of the control device 8, when the liquid detection part 7A detects the liquid raw material L, as in the above first embodiment, it also closes a first control valve 5 regardless of the detected pressure of a pressure detector 6. That is, in this case, when the liquid detection part 7A detects the liquid raw material L, the control device 8 controls to immediately closes both the first control valve 5 and the second control valve 70.

Alternatively, in another aspect, when the liquid detection part 7A detects the liquid raw material L, the control device 8 sends no control command based on the detected signal of the liquid detection part 7A to the first control valve 5, and controls to close only the second control valve 70. That is, in this case, the detected signal of the liquid detection part 7A is used only for controlling the opening and closing of the second control valve 70. In this case, the first control valve 5 is controlled based on the detected signal of the pressure detector 6, as in a conventional example.

The second control valve 70 is disposed in a downstream portion of the vaporizer 2, whereby when there is an inflow beyond the set limit of the liquid raw material L into the vaporizer 2, the inflow of the liquid raw material L from the vaporizer 2 into the external gas passage 32 can be prevented in advance.

In the fourth embodiment described above, the liquid detection part 7A is employed by the temperature detector of the above first embodiment, but in place of the temperature detector, the liquid detection part 7B configured by the level gauge of the above second embodiment, or the liquid detection part 7C configured by the load cell of the above third embodiment can be also employed.

In the above first to fourth embodiments, temperature, liquid level, and weight are shown as the examples of the parameters of the liquid measured by the liquid detection part, but the parameters of the liquid measured by the liquid detection part may be any other parameters which can detect the liquid flowing into the vaporizer beyond the predetermined amount.

The present invention is not limited to the above embodiments, and various forms can be employed unless it is not deviated the gist of the present invention.

REFERENCE SIGNS LIST 1A, 1B, 1C, 1D: Vaporization supply apparatus
2: Vaporizer
2a2: Vaporizing chamber
2b1: First gas heating chamber
2c1: Second gas heating chamber
3: Flow-rate control device
5: First control valve
6: Pressure detector
7A, 7B, 7C: Liquid detection part
8: Control device
70: Second control valve

The invention claimed is:

1. A vaporization supply apparatus comprising:
a vaporizer which heats and vaporizes a liquid,
a pressure-type flow-rate control device which controls a flow rate of a gas sent out from the vaporizer,
a first control valve interposed in a supply channel of a liquid to the vaporizer,
a pressure detector for detecting a pressure of a gas vaporized by the vaporizer and sent to the pressure-type flow-rate control device,
a liquid detection part for measuring parameters of a liquid in an amount higher than a predetermined amount in the vaporizer,
a control device programmed to control the first control valve to supply a liquid to the vaporizer based on a pressure value detected by the pressure detector, and
a second control valve interposed in a gas passage between the vaporizer and the pressure-type flow-rate control device,
wherein the control device is programmed to, when the liquid detection part detects a liquid flowing into the vaporizer in an amount higher than the predetermined amount, control to close the first control valve and the second control valve.

2. The vaporization supply apparatus according to claim 1, wherein the liquid detection part is a temperature detector.

3. The vaporization supply apparatus according to claim 1, wherein the liquid detection part is a level gauge.

4. The vaporization supply apparatus according to claim 1, wherein the liquid detection part is a load cell.

5. The vaporization supply apparatus according to claim 1, wherein the vaporizer is provided with a vaporizing chamber, and the liquid detection part is disposed in the vaporizing chamber.

6. The vaporization supply apparatus according to claim 1, wherein the vaporizer is provided with a vaporizing chamber and a gas heating chamber which is in communication with the vaporizing chamber, and the liquid detection part is disposed in the gas heating chamber.

7. A vaporization supply apparatus comprising:
a vaporizer which heats and vaporizes a liquid,
a pressure-type flow-rate control device which controls a flow rate of a gas sent out from the vaporizer,
a first control valve interposed in a supply channel of a liquid to the vaporizer,
a pressure detector for detecting a pressure of a gas vaporized by the vaporizer and sent to the pressure-type flow-rate control device,
a second control valve interposed in a gas passage between the vaporizer and the pressure-type flow-rate control device,
a liquid detection part for measuring parameters of a liquid in an amount higher than a predetermined amount in the vaporizer, and
a control device programmed to control the first control valve to supply a liquid to the vaporizer based on a pressure value detected by the pressure detector, and control to close the second control valve when the liquid detection part detects a liquid flowing into the vaporizer in an amount higher than the predetermined amount.

8. The vaporization supply apparatus according to claim 7, wherein the liquid detection part is a temperature detector.

9. The vaporization supply apparatus according to claim 7, wherein the liquid detection part is a level gauge.

10. The vaporization supply apparatus according to claim 7, wherein the liquid detection part is a load cell.

11. The vaporization supply apparatus according to claim 7, wherein the vaporizer is provided with a vaporizing chamber, and the liquid detection part is disposed in the vaporizing chamber.

12. The vaporization supply apparatus according to claim 7, wherein the vaporizer is provided with a vaporizing chamber and a gas heating chamber which is in communication with the vaporizing chamber, and the liquid detection part is disposed in the gas heating chamber.

* * * * *